United States Patent
Erickson et al.

(10) Patent No.: US 6,883,109 B2
(45) Date of Patent: Apr. 19, 2005

(54) METHOD FOR ACCESSING SCAN CHAINS AND UPDATING EEPROM-RESIDENT FPGA CODE THROUGH A SYSTEM MANAGEMENT PROCESSOR AND JTAG BUS

(75) Inventors: Michael John Erickson, Loveland, CO (US); Edward A Cross, Fort Collins, CO (US); David R. Maciorowski, Parker, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 633 days.

(21) Appl. No.: 09/918,030

(22) Filed: Jul. 30, 2001

(65) Prior Publication Data
US 2003/0023771 A1 Jan. 30, 2003

(51) Int. Cl.[7] .................................................. G06F 11/00
(52) U.S. Cl. .............................................. 714/5; 714/16
(58) Field of Search ................................ 714/5, 16, 21, 714/27, 42

(56) References Cited

U.S. PATENT DOCUMENTS

| | | | |
|---|---|---|---|
| 4,914,576 A | * 4/1990 | Zelley et al. | 714/21 |
| 5,101,490 A | * 3/1992 | Getson et al. | 710/15 |
| 5,343,478 A | * 8/1994 | James et al. | 714/726 |
| 5,425,036 A | 6/1995 | Liu et al. | |
| 5,428,800 A | 6/1995 | Hsieh et al. | |
| 5,465,056 A | 11/1995 | Hsieh et al. | |
| 5,477,544 A | 12/1995 | Botelho | |
| 5,761,462 A | 6/1998 | Neal et al. | |
| 5,802,268 A | 9/1998 | Fisher et al. | |
| 5,826,048 A | 10/1998 | Dempsey et al. | |
| 5,864,486 A | 1/1999 | Deming et al. | |
| 5,894,571 A | * 4/1999 | O'Connor | 713/2 |
| 5,933,614 A | 8/1999 | Tavallaei et al. | |

(Continued)

FOREIGN PATENT DOCUMENTS

EP      1043656 A2    10/2000

OTHER PUBLICATIONS

XILINX: "XC18V00 Series Of In-System Programmable Configuration PROMs" Jun. 11, 2001.

Dehon, Andre, et al., "Reconfigurable Computing: What, Why And Implications For Design Automation," 1999, ACM Pres, p. 610–615.

Beer, lian, et al., "Establishing PCI Complianc Using Formal Verification: A Case Study," Mar. 28–31, 1995, IEEE 14th Annual International Phoenix Conference on Comput rs And Communications, p. 373–377.

Keahey, "Programming Of Flash With ICT Rights And Responsibilities", IEE, pp. 711–717, 2000.

*Primary Examiner*—Scott Baderman
*Assistant Examiner*—Gabriel L. Chu

(57) ABSTRACT

A method of updating programmable device configuration code stored in EEPROMs of a system is operable on complex systems having separate management and system processors. The method includes executing a sequence for updating programmable device configuration code on a management processor of the system including erasing the EEPROMs, writing at least one block of configuration code to the EEPROMs, and checking for errors after writing. The errors checked for include failure of a FIFO to empty. Upon detecting errors, the method includes automatically retrying writes. Embodiments of the method are operable on systems having multiple serial busses interconnecting EEPROMs to a common configuration logic, and on systems having multiple management processors each capable of accessing the common configuration logic.

8 Claims, 9 Drawing Sheets

U.S. PATENT DOCUMENTS

| | | | |
|---|---|---|---|
| 5,935,233 A | 8/1999 | Jeddeloh | |
| 5,970,005 A | 10/1999 | Yin et al. | |
| 6,031,391 A | 2/2000 | Couts-Martin et al. | |
| 6,044,025 A * | 3/2000 | Lawman | 365/191 |
| 6,055,632 A | 4/2000 | Deegan et al. | |
| 6,137,738 A | 10/2000 | Vorgert | |
| 6,167,358 A | 12/2000 | Othmer et al. | |
| 6,167,477 A | 12/2000 | Garnett et al. | |
| 6,198,303 B1 | 3/2001 | Rangasayee | |
| 6,255,849 B1 * | 7/2001 | Mohan | 326/41 |
| 6,289,406 B1 | 9/2001 | Chambers | |
| 6,314,550 B1 | 11/2001 | Wang et al. | |
| 6,366,973 B1 | 4/2002 | Lo et al. | |
| 6,401,153 B1 | 6/2002 | Pawlowski | |
| 6,405,276 B1 | 6/2002 | Chen et al. | |
| 6,427,198 B1 * | 7/2002 | Berglund et al. | 711/170 |
| 6,430,710 B1 | 8/2002 | Morivama et al. | |
| 6,459,297 B1 | 10/2002 | Smiley | |
| 6,460,108 B1 | 10/2002 | McCoskey et al. | |
| 6,501,682 B1 * | 12/2002 | Yoshida | 365/185.22 |
| 6,526,332 B1 * | 2/2003 | Sakamoto et al. | 700/259 |
| 6,529,989 B1 | 3/2003 | Bashford et al. | |
| 6,567,414 B1 | 5/2003 | Deng et al. | |
| 6,614,259 B1 * | 9/2003 | Couts-Martin et al. | 326/40 |
| 6,622,206 B1 * | 9/2003 | Kanamaru et al. | 711/113 |
| 6,622,246 B1 | 9/2003 | Biondi | |
| 6,629,179 B1 | 9/2003 | Bashford | |
| 6,636,927 B1 | 10/2003 | Peters et al. | |
| 6,658,508 B1 | 12/2003 | Reiss et al. | |
| 6,658,519 B1 | 12/2003 | Broberg et al. | |
| 6,691,205 B1 * | 2/2004 | Zilberman | 711/103 |
| 2002/0070753 A1 | 6/2002 | Vogel et al. | |
| 2003/0005207 A1 | 1/2003 | Langendorf et al. | |
| 2003/0120974 A1 | 6/2003 | Adams et al. | |

* cited by examiner

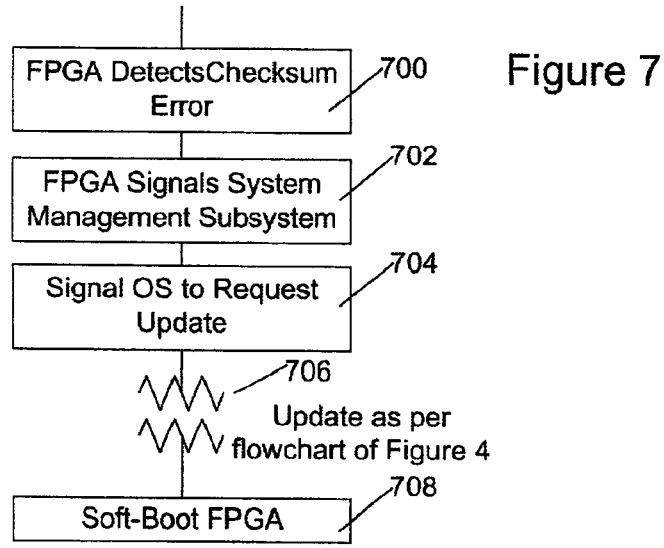
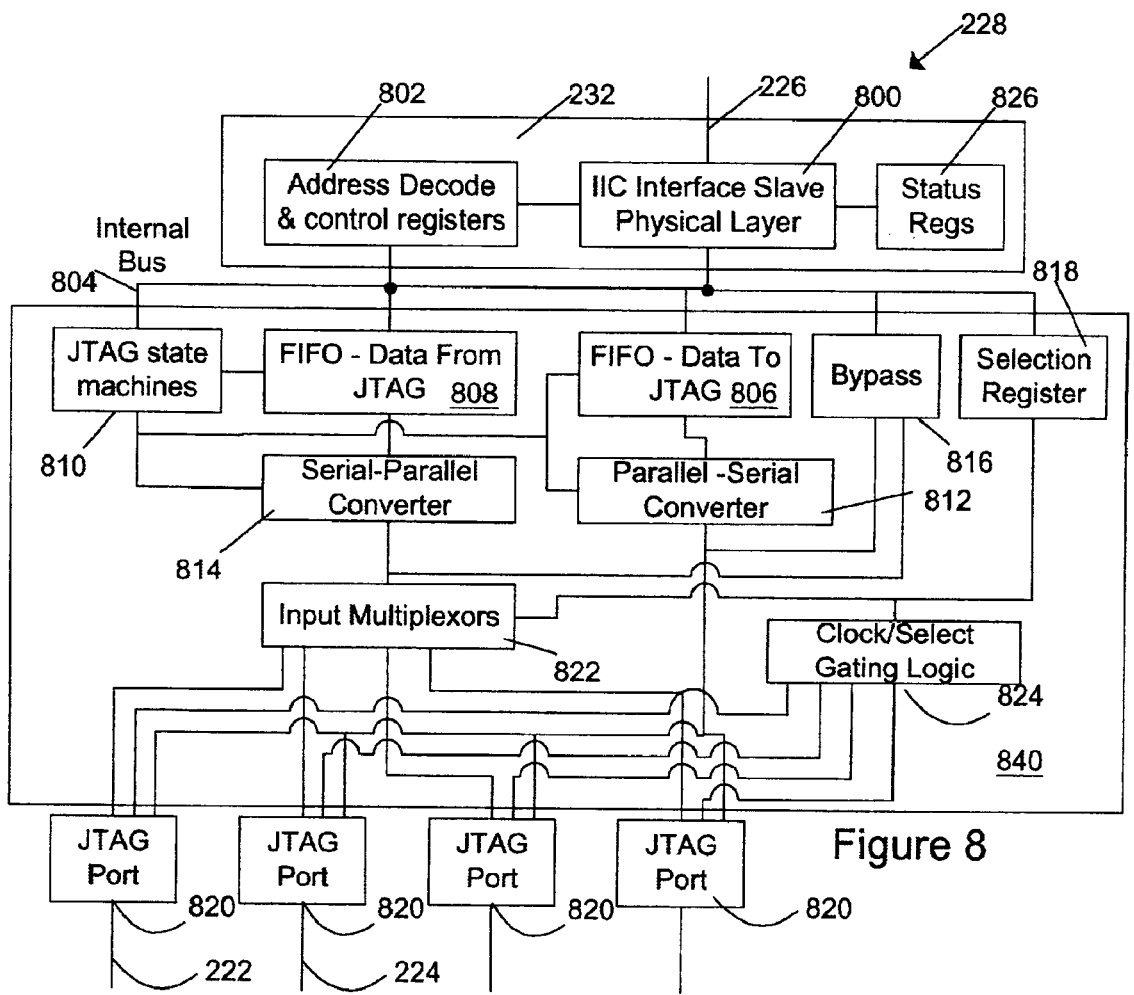

METHOD FOR ACCESSING SCAN CHAINS AND UPDATING EEPROM-RESIDENT FPGA CODE THROUGH A SYSTEM MANAGEMENT PROCESSOR AND JTAG BUS

RELATED APPLICATIONS

This application is related to copending and cofiled applications for U.S. patent Ser. No. 09/918,023, filed Jul. 30, 2001 and entitled METHOD AND APPARATUS FOR IN-SYSTEM PROGRAMMING THROUGH A COMMON CONNECTION POINT OF PROGRAMMABLE LOGIC DEVICES ON MULTIPLE CIRCUIT BOARDS OF A SYSTEM; Ser. No. 09/918,024, filed Jul. 30, 2001 and entitled METHOD AND APPARATUS FOR SERIAL BUS TO JTAG BUS BRIDGE; Ser. No. 09/917,983, filed Jul. 30, 2001 and entitled SYSTEM AND METHOD FOR IN-SYSTEM PROGRAMMING THROUGH AN ON-SYSTEM JTAG BRIDGE OF PROGRAMMABLE LOGIC DEVICES ON MULTIPLE CIRCUIT BOARDS OF A SYSTEM; and Ser. No. 09/917,982, filed Jul. 30, 2001 and entitled METHOD FOR JUST-IN TIME UPDATING OF PROGRAMMING PARTS, all of the aforementioned applications incorporated herewith by reference thereto.

FIELD OF THE INVENTION

The invention is related to the art of in-system programming of programmable logic devices. In particular the invention relates to a method having particular utility for in-system programming of EEPROMs that provide configuration code to Field Programmable Gate Arrays, the method operable in firmware of a system management processor, and using an IIC-to-JTAG bus bridge.

BACKGROUND OF THE INVENTION

Serial communications busses of the separate-clock-and-data type have become commonly used for communication between integrated circuit components of a system. Serial links of this type include the IIC (initially known as the Inter IC bus, now widely known as I2C) and SPI busses. Links of this type can be implemented without need of precision timing components at each integrated circuit on the bus and typically operate under control of at least one bus master. Serial EEPROM (Electrically Erasable Programmable Read-Only Memory) devices are widely available that interface with serial communications busses of the SPI and IIC types.

While the I2C and SPI busses are typically used for communications within systems during normal operation, the IEEE 1149.1 serial bus, known as the JTAG bus, was intended for testing of inactive systems by providing access from a tester to perform a boundary scan on each integrated circuit. The tester can thereby verify connectivity of the integrated circuits and verify that they are installed and interconnected correctly. The JTAG bus provides for interconnection of one or more integrated circuits in a chain, any of which may be addressed by the tester. Typically, multiple devices of a circuit board are interconnected into a JTAG bus, also known as a JTAG chain.

The JTAG bus is a serial bus having four connections to each device. These include a serial data-in line, a serial data-out line, a clock line, and a test mode select line. Typically the data-out line of a first chip in a chain couples to the data-in line of a second chip of the chain, and the data-out line of the second chip couples to the data-in line of a third. The data-in and data-out lines of multiple chips are therefore coupled in a daisy-chain configuration.

The IEEE 1152 bus is a newer, enhanced, version of the 1149.1 JTAG bus. References herein to a JTAG bus are intended to include both the 1149.1 and 1152 variations.

Programmable Logic Devices, herein referenced as PLDs, are commonly used as components of computer systems. These devices include a Programmable Array Logic devices (PALs), Programmable Logic Arrays (PLAs), Complex Programmable Logic Devices (CPLDs), and Field Programmable Gate Arrays (FPGAs). PLDs are typically general-purpose devices that take on a system-specific function when a function-determining, or configuration, code is incorporated within them. PLDs may store the function-determining code in fusible links, antifuses, EPROM cells, EEPROM cells including FLASH cells, or static RAM cells.

Those PLD devices which utilize static RAM cells to hold their function-determining code may be designed to automatically retrieve that code from an EEPROM on the same or different integrated circuit at system power-up. Many common FPGA devices available from Xilinx, Altera, Lucent, and Atmel are known as SRAM-based FPGAs because they store their codes in static RAM cells.

FPGAs of this type are known that can retrieve configuration code from an external EEPROM in either serial or parallel mode at system power-up. These devices are typically configured to automatically retrieve their configuration code on system power-up. FPGAs that retrieve configuration code in serial mode can be designed to use a custom serial bus designed for loading code into an FPGA, and can be designed to use a standard serial bus such as the IIC and SPI busses although many such devices use custom serial busses. The term serial bus as used herein therefore is inclusive of IIC, SPI, and custom serial busses.

FPGAs are also known that are capable of performing a checksum verification on their configuration code when they receive it from an EEPROM. These FPGAs generate an error signal when the checksum verification fails, indicating that their configuration code might not be correct.

It is known that some EEPROM devices, including but not limited to Xilinx XC18V00 series devices, can interconnect to the JTAG bus and may be erased and programmed with a configuration code over the JTAG bus. Further, it is known that these devices can be connected to an FPGA to provide configuration code to the FPGA. It is also known that some FPGA devices can also interconnect to a JTAG bus for test or configuration purposes.

It is known that a portable programming device may connect to a JTAG bus of a board through an in-system configuration header on the board. The JTAG bus couples to at least one JTAG-configurable EEPROM on the board, that are in turn coupled to configure FPGAs on the board. A configuration system is coupled to the JTAG bus through the header; and the system is placed in a configuration mode. Configuration code is then written from the configuration system, through the header, and over the JTAG bus, into the EEPROM. Once the code is in the EEPROM, system power may be cycled; at which time the configuration code is transferred into the associated FPGA. This process is outlined in XILINX datasheet DS026 and other documents available from XILINX.

The configuration system is typically a notebook computer having configuration code for the FPGAs of the board. The configuration system also has suitable software and hardware for driving the JTAG bus of the board, together with knowledge of the JTAG bus configuration of the board.

While loading FPGA configuration code into EEPROMs of a board works well for small systems, it can pose difficulties with large systems. Large systems may have multiple boards, not all of which are connected to the same JTAG bus. Separate chains are often used because:
1. a configuration system must have knowledge of all devices in the chain in order to properly address any device on the chain; if a single chain is used the configuration system must have detailed knowledge of every board in the system.
2. large systems may, and often do, have slots permitting later addition or upgrade of peripheral devices, memory subsystems, processors, and other subsystems; additional circuitry would be required to avoid breaking a single chain at any empty slot.
3. large systems are often customized before shipment with a specific set of peripheral devices, memory subsystems, processors, and other devices; a single chain could require customized JTAG interface software for each system configuration.
4. access is faster to devices in short chains than to devices in long chains. A single board may, but need not, therefore embody more than one chain within the board.

The prior configuration process also poses difficulties when separate JTAG busses are used to load FPGA configuration code into EEPROMs of each board of a large system. For example, the multiple circuit boards of large systems are often not readily accessible for coupling of a configuration system to a configuration header without removing them from the system. Certain boards may be accessible, but only if one or more additional boards are first removed from the system. Physical access to a system by a technician also may require travel expense. In either case, substantial labor and system downtime may be required to update the FPGA configuration codes of all boards of a large system.

It is known that computer systems may have more than one data communications bus for different purposes. For example, commonly available computers have a PCI bus for communications with peripheral interface cards, one or more processor busses interfacing to each processor, and busses of other types. Complex systems may also utilize serial busses for particular purposes. For example, a complex computer system may use an IIC or SPI bus as a system management bus.

A bus bridge is a device for interconnecting busses of different types. For example, a typical personal computer utilizes at least one bus bridge between parallel busses, coupling a processor bus to a PCI bus. Typical personal computers also utilize a bus bridge between the parallel PCI bus and an ISA bus.

A system management bus may provide an interface to system functions including, but not limited to, power supply voltage monitors, temperature sensors, fan controls, and fan speed monitors to a dedicated system management processor. The system management processor may in turn be interfaced through appropriate hardware, which may include one or more bus bridges, to other processors of the system.

In such a system, the system management processor may monitor system functions and determine if any system functions exceed limits. When limits are exceeded, the system management processor can protect the system by altering fan speeds, by instructing the system to operate in particular modes, including shutdown, or by other means known in the art.

Complex computer systems may embody multiple FPGAs and other PLDs. FPGAs may be used for customized I/O functions interfacing CPUs of the system to other devices, for communications between CPUs, and to interface devices such as fans and temperature sensors to a system management bus.

SUMMARY OF THE INVENTION

The present invention is a method of in-system programming of programmable devices. The method is particularly applicable for the programming of EEPROMs with configuration code for FPGAs associated therewith. The method utilizes a bus bridge, bridging an IIC serial bus to several JTAG busses.

A particular embodiment is used in a system having multiple boards, where some boards have multiple EEPROMS coupled to provide configuration code to FPGAs. The EEPROM devices of each such board are coupled into a JTAG bus, with one or more separate buses for each such board. The JTAG busses from each board are routed to the bus bridge. The bus bridge provides an interface between the multiple JTAG busses and a system management processor of the system, as well as selection circuitry such that the processors may select an individual JTAG bus of the multiple JTAG busses.

The method incorporates error checking and retry. For example, FIFOs of the bus bridge are monitored to determine if state machines of the bus bridge correctly wrote information to the EEPROMs, or whether information properly transferred from the EEPROMs through the bus bridge to the system management processor. The method provides for retries when operations fail. The method also provides verification that configuration code data files are compatible with target EEPROMs, busses, and boards.

BRIEF DESCRIPTION OF THE DRAWINGS

FIG. 7, an illustration of functions enabling self-healing of a system having corrupt FPGA code in accord with the invention;

FIG. 8, a further detailed block diagram of the common configuration logic of an embodiment of the invention;

DETAILED DESCRIPTION OF THE EMBODIMENTS

Figure 1:
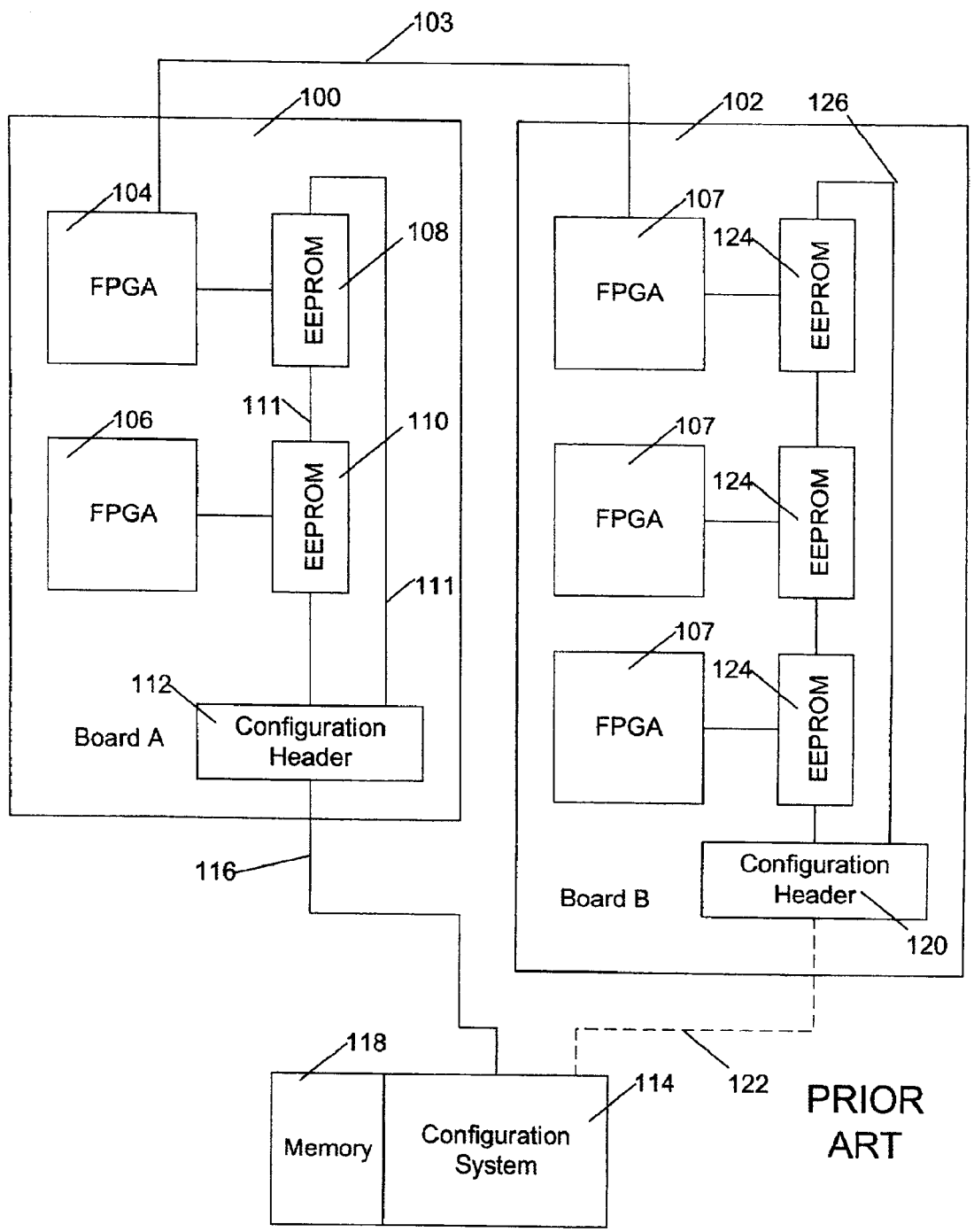
FIG. 1 is a block diagram of a prior art computer system having multiple JTAG busses on multiple boards, each board having a separate configuration header.

A computer system as known in the art incorporates multiple circuit boards, such as Board A 100 (FIG. 1) and Board B 102 embodying FPGAs 104, 106, 107 on the boards. There may be additional boards in the system, both with and without FPGAs, the various boards being coupled together 103 as components of the system. On Board A 100, FPGA 104 is coupled to a configuration EEPROM 108, such that FPGA 104 receives its configuration code from EEPROM 108 when Board A 100 is powered-up. Similarly, FPGA 106 is coupled to a second configuration EEPROM 110. Configuration EEPROMs 108 and 110 are chained together in a JTAG bus 111 that is brought out to a configuration header 112.

When it is desired to update configuration code of one or more of the FPGAs 104 or 106 on Board A 100, a configuration system 114 is coupled through a configuration cable 116 to configuration header 112. Configuration code may then be transferred from a memory system 118 of configuration system 114 through configuration cable 116, configuration header 112, over the JTAG bus 111, into an EEPROM such as EEPROM 108. Once this is accomplished, power may be cycled to cause FPGA 104 to load the updated configuration code from EEPROM 108.

When it is desired to update configuration code of FPGAs on a different board, such as Board B 102, the configuration cable 116 is disconnected from configuration header 112 and coupled to an appropriate configuration header 120 of Board B, along an alternate configuration cable routing 122. The process is then repeated to update one or more EEPROMs of EEPROMs 124 over a Board B JTAG bus 126.

The prior-art in-system FPGA configuration code update apparatus illustrated in FIG. 1 requires physical access to each board of the system that is to be updated. The configuration cable 116 must be connected to the appropriate configuration header of each board separately.

Figure 2:
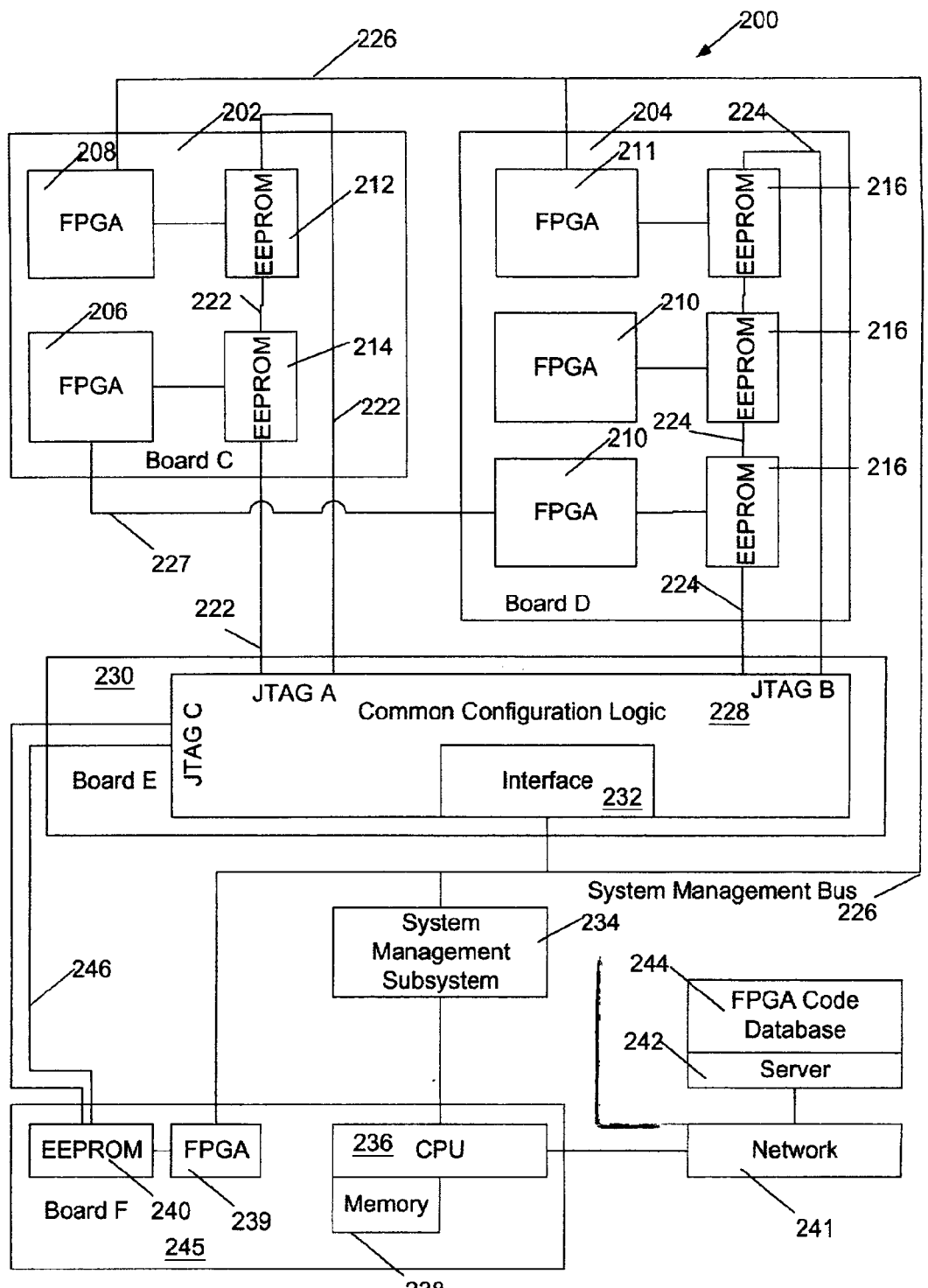
FIG. 2, a block diagram of a computer system embodying the invention having multiple JTAG busses from multiple boards brought to a common configuration logic, having an interface to a processor of the system for programming EEPROMS over the multiple JTAG busses.

In a system 200 (FIG. 2) according to the present invention, there are several circuit boards, such as Board C 202 and Board D 204, each having one or more FPGAs 206, 208, 210 and 211. FPGAs 206, 208, 210, and 211 are of the SRAM-based type and are coupled to receive their configuration code from EEPROMs, such as EEPROMs 212, 214, and 216. EEPROMs 212 and 214 of Board C 202 are connected into a Board C JTAG bus 222, and the EEPROMs 216 of Board D 204 are connected into a Board D JTAG bus 224. Boards C 202 and D 204 are further interconnected to a system management bus 226, which may, but need not, connect to some of the FPGAs, such as FPGA 208 of Board C 202 and FPGA 211 of Board D 204. Boards of the system, such as Boards C 202 and D 204 are interconnected with additional system interconnect 227 for other purposes. Additional system interconnect 227 may include apparatus for communicating between multiple processors of the system, between processors and peripheral devices, and other interconnect as required in a computer system.

Board C JTAG bus 222 and board D JTAG bus 224 are brought to a common configuration logic 228, which may be located on another board such as Board E 230. The common configuration logic 228 embodies an IIC serial interface 232 that is connected to the system management bus 226. System management bus 226 is also connected to at least one system management subsystem 234, which incorporates at least one processor having associated memory. System management subsystem 234 is connected to at least one central processing unit (CPU) 236 of the computer system, which may have several CPUs.

A particular embodiment of the computer system has sixteen CPUs, another embodiment has four CPUs. Each CPU, such as CPU 236 located on Board F 245, has associated memory 238 and is part of a partition that is capable of running an operating system such as Microsoft Windows, Linux, HP-Unix or other operating systems as known in the art. The CPUs may be located on a board, such as Board F 245, having an FPGA 239 coupled to receive configuration code from an EEPROM 240, that is in turn coupled to a JTAG bus 246 accessible for programming from common configuration logic 228. CPU 236 is coupled to a network 241, which may incorporate local area networks (LAN), firewalls, and wide area networks (WAN) such as the Internet. Also coupled to the network 241 is a server 242 having an FPGA configuration code database 244.

In an alternative embodiment, the system management subsystem 234 has a direct connection to the network 241.

At a greater level of detail, common configuration logic 228 (FIG. 3) has a selection register 300 that is addressable through IIC interface 232. Selection register 300 designates which of several JTAG ports, such as ports 304, 306, and 308 of common configuration logic 228 are active. A particular embodiment has sixteen JTAG ports. There is also a JTAG engine 310 accessible through IIC interface 232 that is capable of interpreting commands from the IIC interface 232 and manipulating the active JTAG port in obedience to these commands.

The common configuration logic 228 is therefore capable of operating as a multiple-channel JTAG to IIC bus bridge, as illustrated in FIG. 8.

The IIC interface 232 of common configuration logic 228 is coupled to system management subsystem 234 via system management bus 226. System management subsystem 234 has at least one processor, and in an embodiment has a hierarchy of processors, including primary system management processor 312, and one or more secondary system management processors 314. Each processor has associated memory, such as memory 316, which may be embodied on the same integrated circuits as its associated processor; and each processor is coupled to communicate with the primary system management processor 312. System management subsystem 234 also has an interface 318 for communicating with a CPU 236. Network 241 has local area network (LAN) components 320, firewalls 322, and wide area network components (WAN) such as the Internet 324. CPU 236 is capable of coupling through network 241 to server 242 in a secure, encrypted, mode.

When it is desired that FPGA code be updated on one or more boards of the computer system 200, a CPU 236 executes a host FPGA update routine. CPU 236 of the system thereupon connects 400 (FIG. 4, with reference to FIGS. 2 and 3) to the server 242 in secure mode and downloads 402 an updated FPGA configuration code file to memory 238. Memory 238 may incorporate disk memory and/or RAM memory as known in the art of computing systems. Next, the FPGA configuration code file is transferred 404 to memory 316 of the system management subsystem 234. This transfer 404 may occur as a complete file transfer prior to initiation of EEPROM programming, or as a transfer of individual elements, or blocks, of the FPGA configuration code file. A particular embodiment performs this transfer 404 in a block mode. System CPU 236 then starts 405 a FPGA configuration routine on a processor, such as primary processor 312 or local processor 314, of the system management subsystem 234. In a particular embodiment it runs on primary system management processor 312, passing commands through a local processor 314 to the IIC interface 232 of common configuration logic 228.

In an alternative embodiment, when it is desired that FPGA code be updated on one or more boards of the computer system 200, a processor, such as processor 312, of the system management subsystem 234 connects 400 to the server 242 in secure mode and downloads 402 an updated FPGA configuration code file to memory 316 of the system management subsystem 234. The processor 312 of the system management subsystem then executes an FPGA configuration routine.

In both embodiments, the system management subsystem processor 312 then checks 406 whether any optional configuration header 514 (FIG. 5, discussed below) is connected to a configuration system, and declares an error if it is so connected. Next, the system management subsystem processor 312 arbitrates as necessary to allocate 407 the common configuration logic 228; should another processor be using the common configuration logic 228, system management subsystem processor 312 waits until the common configuration logic 228 is available. Allocation prevents any other system management subsystem processors, such as backup system management processor 528 (FIG. 5, discussed below) from accessing the same EEPROM while it is being programmed and thereby helps prevent code corruption. Allocation also prevents any other system management subsystem processors, such as backup system management processor 528 (FIG. 5, discussed below) from altering the state of the common configuration logic 228, and thereby helps prevent disruption of transfers over the JTAG busses 222 or 224.

The system management subsystem processor 312 then initializes common configuration logic 228, including purging any data remaining in FIFOs of the common configuration logic 228, and sets 409 selection register 300 with an identity of the particular JTAG bus coupled to the EEPROMs to be programmed.

The processor 312 next addresses, through the common configuration logic 228, the selected JTAG bus and determines 410 the JTAG bus configuration, including the number and types of devices on the bus. This is accomplished in part through using the JTAG "GET_DEVICE_ID" command, which returns an identification code indicative of the type of each device connected to the JTAG bus. This bus configuration, including the identification codes, is compared 412 against information in the FPGA code file to ensure that the code is compatible with the targeted JTAG bus. Should the code be incompatible with the selected board and targeted JTAG bus, an error is declared 414, and an error handler 424 may attempt to automatically locate and download an appropriate code file. These steps verify compatibility of the code file with the selected circuit board.

In an alternative embodiment, instead of, or in addition to, comparing JTAG bus configuration against information in the code file, board identification information is read from an EEPROM 512 (FIG. 5) located on each board. This EEPROM is added to a JTAG bus 510 on each board. This identification information may be used to verify compatibility of the code file with the board and targeted JTAG bus, to select appropriate FPGA code from among several FPGA codes contained within a code file, and to locate an appropriate FPGA code file in the FPGA code database 244 on server 242.

After verifying compatibility of the code file, the system management subsystem erases 416 (FIG. 4, with reference to FIGS. 2 and 3) one or more EEPROMs, such as EEPROM 214 of the board that are attached to the selected JTAG bus 222. More than one EEPROM may be erased should the FPGA code file contain code for more than one FPGA of the board. Then, the configuration system writes 418 new code information to the erased EEPROM(s) via JTAG bus 222. Finally, the system management subsystem checks 420 for errors in the EEPROM writing process 418, and declares an error 422 if any error occurred. If the code file was not written correctly into the EEPROMS of the board, an error handler 424 may repeat steps 402 through 422; downloading a compatible FPGA configuration code file, transferring the file to the system management subsystem, erasing the EEPROMs, and writing the EEPROMs.

Once the EEPROMs have been programmed on a board, the system management subsystem processor releases 423 the common configuration logic 228 so it may be accessed by any other processors of the system management subsystem. Next, the host FPGA update routine checks 426 to see if any additional boards, or additional JTAG busses of the same board, are to be programmed. Appropriate steps, including steps of downloading FPGA code into the system management subsystem, erasing EEPROMs, and programming EEPROMs, are repeated as necessary for these additional boards or JTAG busses.

Once all EEPROMs of all JTAG busses requiring update have been programmed, the system 200 may be power-cycled 428 which will cause each FPGA, such as FPGA 208 to load updated configuration code from the associated EEPROMs, such as EEPROM 212.

FPGAs having associated EEPROMs programmable in this way may include FPGAs 239 on boards, such as Board F 245, having system CPUs 236. FPGAs having associated EEPROMs programmable in this way may also include the common configuration logic 228 itself, which in an embodiment is implemented as an FPGA having associated configuration EEPROM 330.

As a backup measure, one or more boards of the system 200 may have a configuration header 514 coupled in parallel as an additional way of programming its FPGAs. In this way the board may be accessed for programming by a field service or factory refurbishment technician should it have been accidentally programmed with incorrect or defective FPGA configuration code. For example, a backup configuration header permits repair of the system 200 should EEPROM 330 associated with the common configuration logic 228 be corrupted by a power failure during programming via JTAG D 335.

In a particular embodiment a board 500 (FIG. 5) has a first FPGA 502 and a second FPGA 504. FPGAs 502 and 504 are coupled to receive their configuration code from EEPROMs 506 and 508, which are coupled into JTAG bus 510. Also coupled into the JTAG bus 510 is a board identification EEPROM 512, and a configuration header 514. The JTAG bus 510 is brought out of the board 500 to common configuration logic 516 of the system.

Checksum error lines 518 and 520 are brought from FPGAs 502 and 504 to a local management processor 522 which may or may not be located on the same board 500.

Local management processor 522 is coupled to system management bus 524. The system management bus 524 is coupled to a primary system management processor 526. A backup system management processor 528 is provided in failover configuration with the primary system management processor to provide redundancy. The local management processor is also coupled to an FPGA reload command line 530 connected to each FPGA, including FPGAs 502 and 504 of the board 500. The primary and backup system management processors 526 and 528 each connect to at least one system CPU (not shown) of the system.

Figure 4:
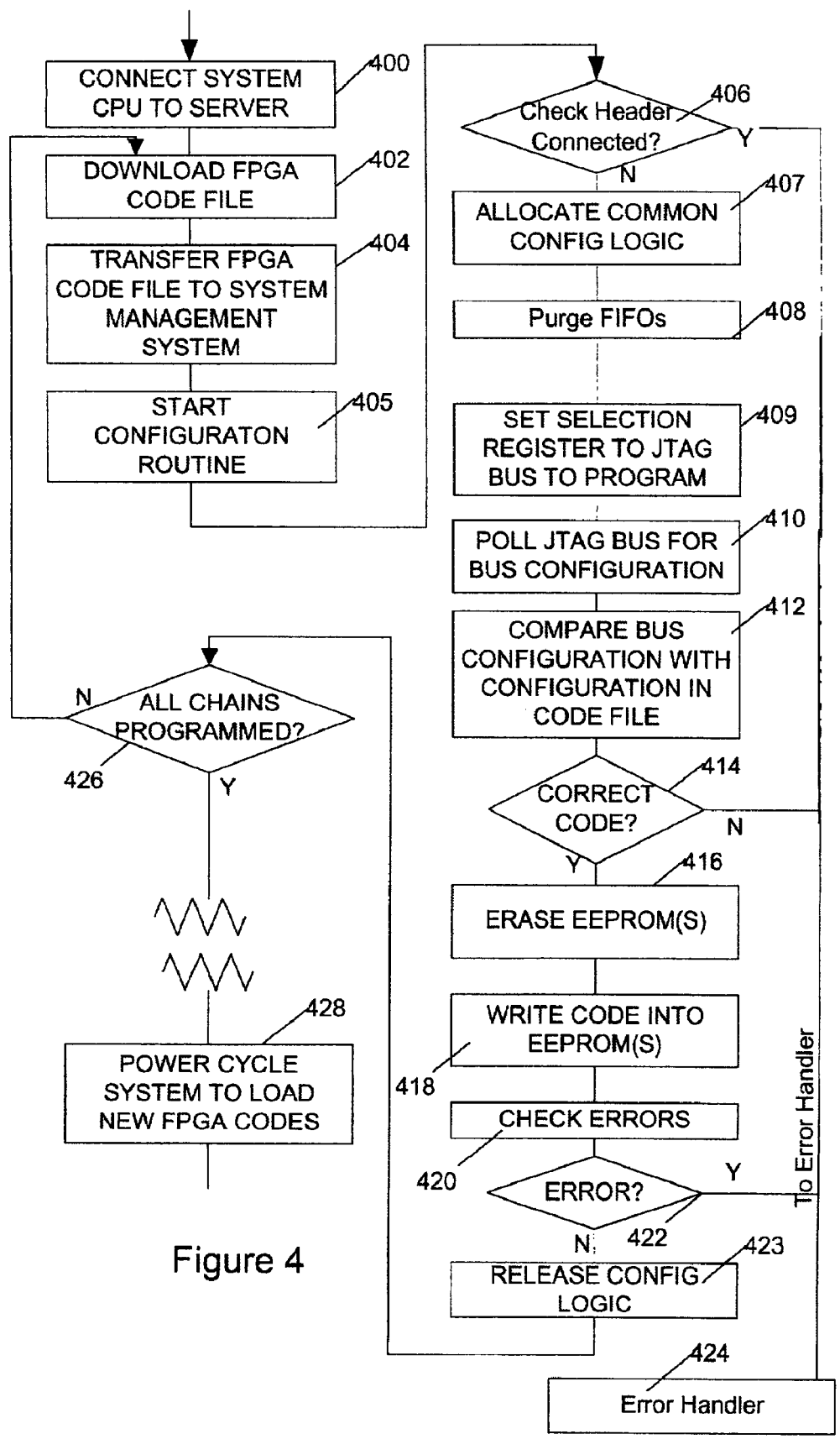
FIG. 4, a flowchart of a method of configuring FPGAs of a system through a common system-configuration logic.
Figure 5:
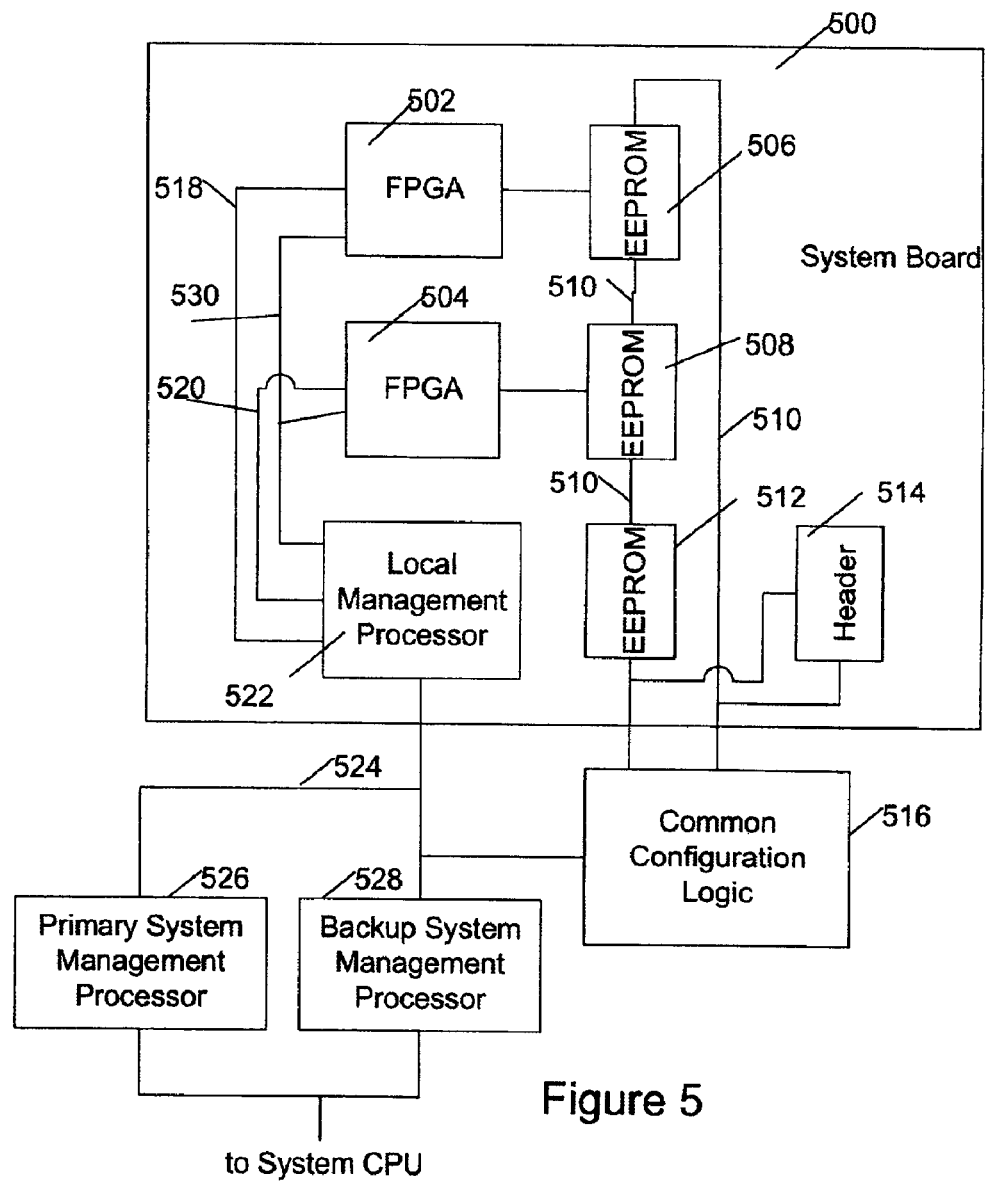
FIG. 5, a detailed block diagram of a board of an embodiment of the invention, having a local system management processor coupled to receive error signals from FPGAs, a configuration header, and a board identification EEPROM, showing connectivity to system management processors and common configuration logic.

With the embodiment of FIG. 5, the step of power cycling 428 (FIG. 4) the system upon completion of programming EEPROMs is not necessary. This step is replaced with the steps of temporarily disabling system use of logic on the FPGAs, soft-booting the FPGAs associated with the reprogrammed EEPROMs to reload their configuration code, and re-enabling system use of logic on the FPGAs.

In this embodiment, when a checksum error is detected by an FPGA, such as FPGA 504, it signals 702 (FIG. 7) the system management subsystem. Signaling the system management subsystem may occur through connection of checksum error line 520 to a different FPGA of the system management subsystem, through custom logic or a gate array, or through an I/O line of a system management processor such as local system management processor 522. Local system management processor 522 then signals an operating system running on a CPU, such as CPU 236, of the system to request an update of the EEPROM 508 associated with the FPGA 504 that detected the error.

Once the error has been detected and update requested, update proceeds 706 as previously discussed with reference to FIG. 4, except that on completion of programming the EEPROMs, the associated FPGA is soft-booted 708 instead of power cycling the system. Soft-booting is accomplished by shutting down drivers or system management functions that use a particular FPGA, triggering a load of configuration code from the associated EEPROM into the FPGA, and restarting any drivers or system management functions that utilized the FPGA. It is therefore possible to update configuration code for at least some of the FPGAs of the system without completely shutting down the system.

Figure 6:
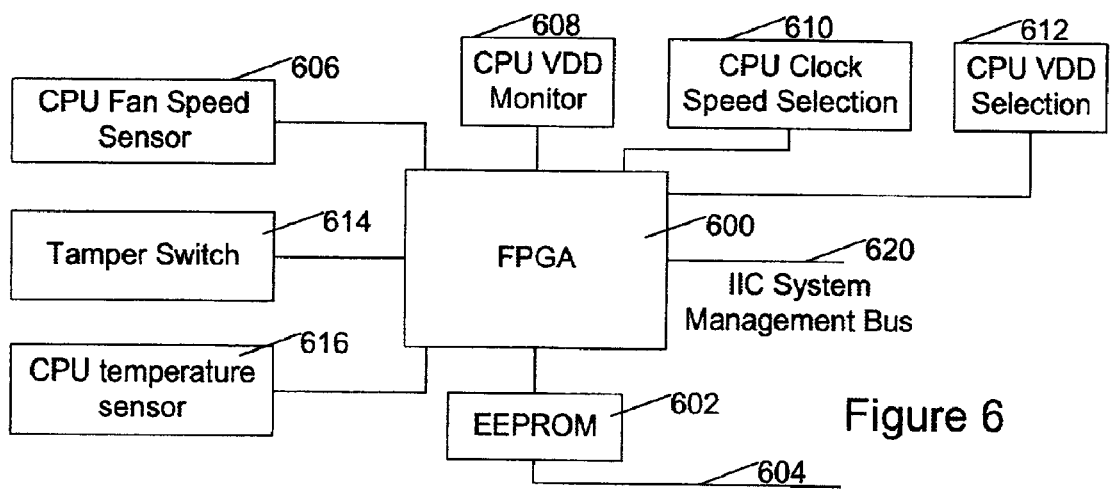
FIG. 6, a detailed block diagram of a portion of a system management subsystem embodying the present invention.

In a particular embodiment, FPGAs, such as FPGA 600 (FIG. 6) of a system management subsystem of a complex computer system are coupled to receive their configuration code from an EEPROM 602. EEPROM 602 is coupled to be programmable over a JTAG bus 604 from common configuration logic as heretofore discussed. The FPGA 600 is coupled to an assortment of system management sensors and system management hardware, which may include but is not limited to fan speed sensors 606, voltage monitors 608, CPU clock speed selection circuitry 610, CPU voltage selection circuitry 612, tamper switches 614, and temperature monitor circuitry 616. FPGA 600 embodies logic for communication between these system management sensors and hardware over an IIC system management bus 620 with a system management processor.

In another embodiment of the present invention, FPGAs that receive their configuration code from EEPROMs capable of being in-system programmed in the manner herein discussed are used for routing of I/O information between I/O peripherals and particular system CPUs of the system. In yet another embodiment, FPGAs that receive their configuration code from EEPROMs capable of being in-system programmed in the manner herein discussed are used for interprocessor communications between system CPUs.

At still greater detail, the common configuration logic 228 (FIG. 8) IIC interface 232 has a slave mode physical layer 800 and address decode and control registers 802. These interface the IIC bus 226 to an internal, parallel, bus 804. The common configuration logic, or bus bridge, also has apparatus 840 for coupling the IIC interface 232 to JTAG ports 820. Two hundred fifty-six byte data-to-JTAG FIFO 806 and data-from-JTAG FIFO 808 are provided for buffering data transfers between the IIC and JTAG busses. Data can be transferred between IIC bus 226 and FIFOs 806 and 808 through IIC slave physical layer 800. JTAG state machines 810 enable single IIC commands to reset JTAG targets, read JTAG configuration, or transfer up to two hundred fifty six consecutive bytes between FIFOs 806 or 808 and a JTAG device through parallel-serial converter 812 or serial-parallel converter 814 according to the direction of the transfer. A simple bypass port 816 allows for bypassing of the state machines 810 and FIFOs 806 and 808 in the event of logic error or need to perform unusual JTAG commands.

Selection register 818 is addressable through the IIC interface 232. Selection register 818 designates one of several JTAG ports 820 to be active at any time. This is done by instructing a multiplexor 822 to couple a specific data line from a JTAG port 820 to serial-parallel converter 814; and by designating which JTAG port 820 is to receive JTAG select lines from clock & select gating logic 824.

Figure 9:
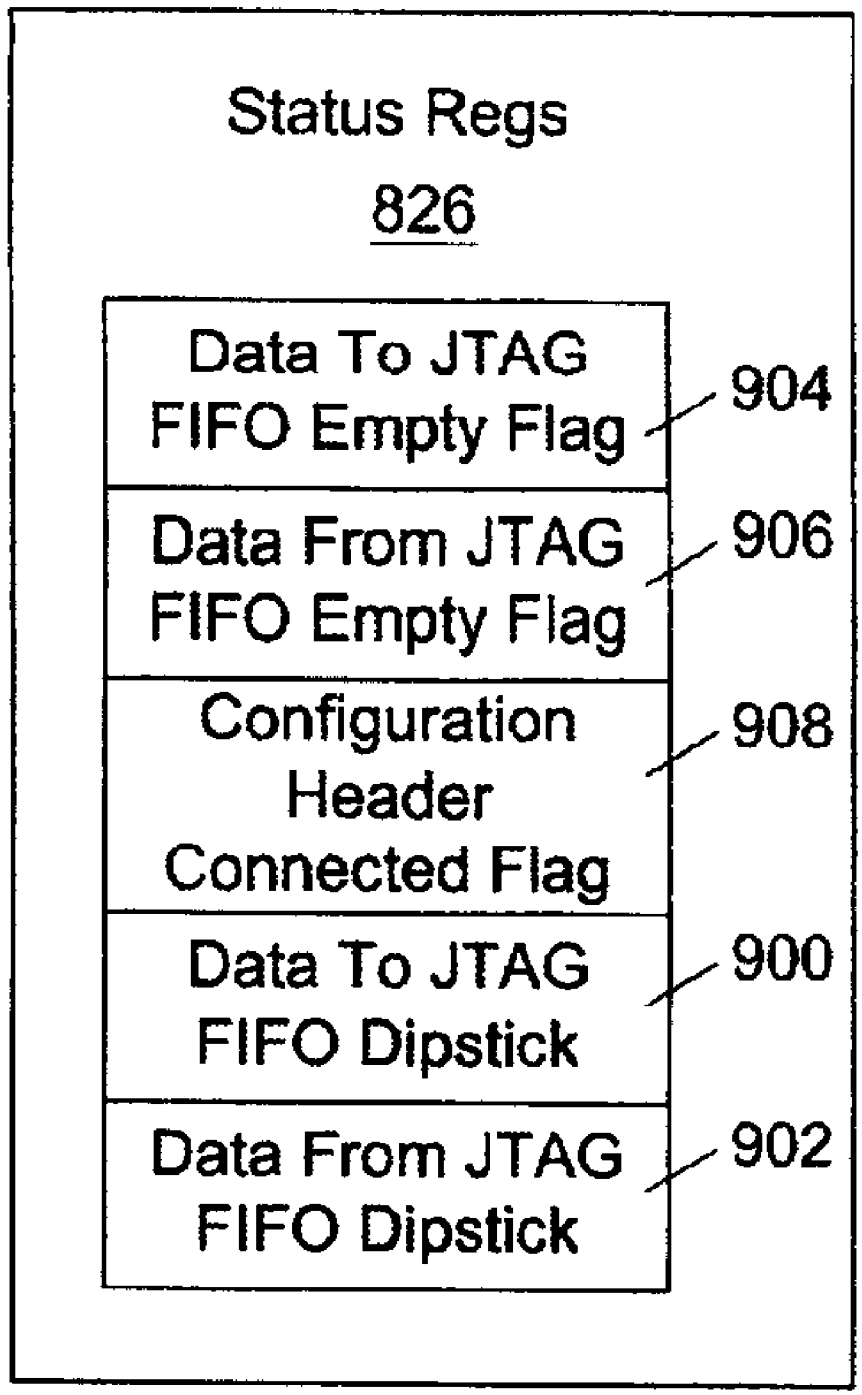
FIG. 9, a further detailed block diagram of status registers of the common configuration logic of an embodiment of the invention.

The common configuration logic 228 also has a status register 826, which includes error flags, FIFO dipsticks 900 and 902 (FIG. 9), FIFO empty flags 904 and 906, and a configuration header connected flag 908. The configuration header connected flag 908 indicates whether any of the optional configuration headers, such as header 514, is connected to a configuration system. If a configuration system is connected to a header 514, the system management processor 526 identifies this when it checks 406 for a header connected, and will refuse to program EEPROMs to prevent accidental corruption of EEPROM contents.

The FIFO empty flags 904 and 906 are tested to ensure all transfers are complete when the system management subsystem processor 312 checks for errors 420 after writing code 418 to the EEPROMs.

Figure 3:
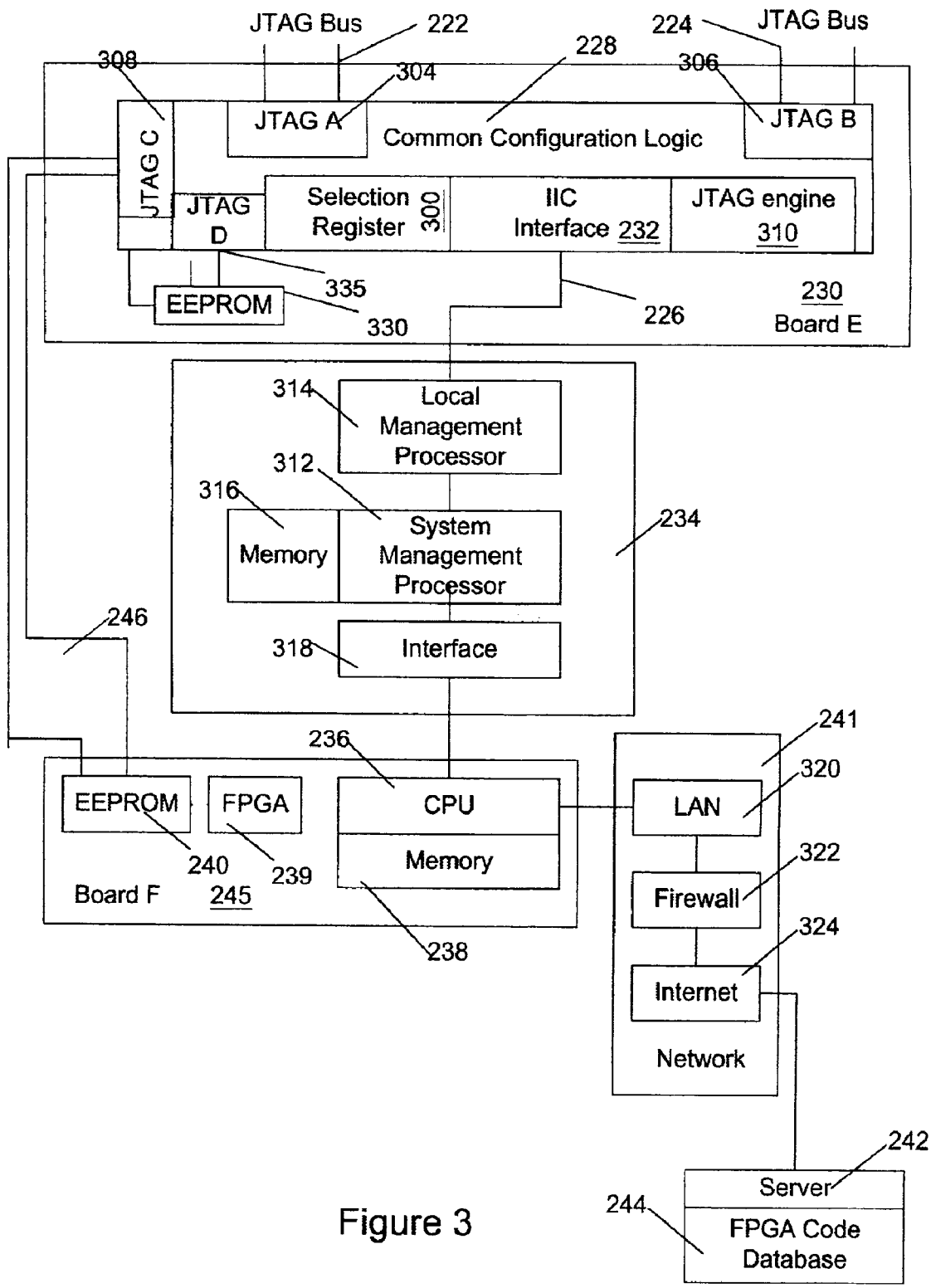
FIG. 3, a detailed block diagram of the common configuration logic and system management subsystems of the system of FIG. 2, embodying a JTAG to IIC bridge, with system management and host processors and showing connection to a database over a network.
Figure 10A:
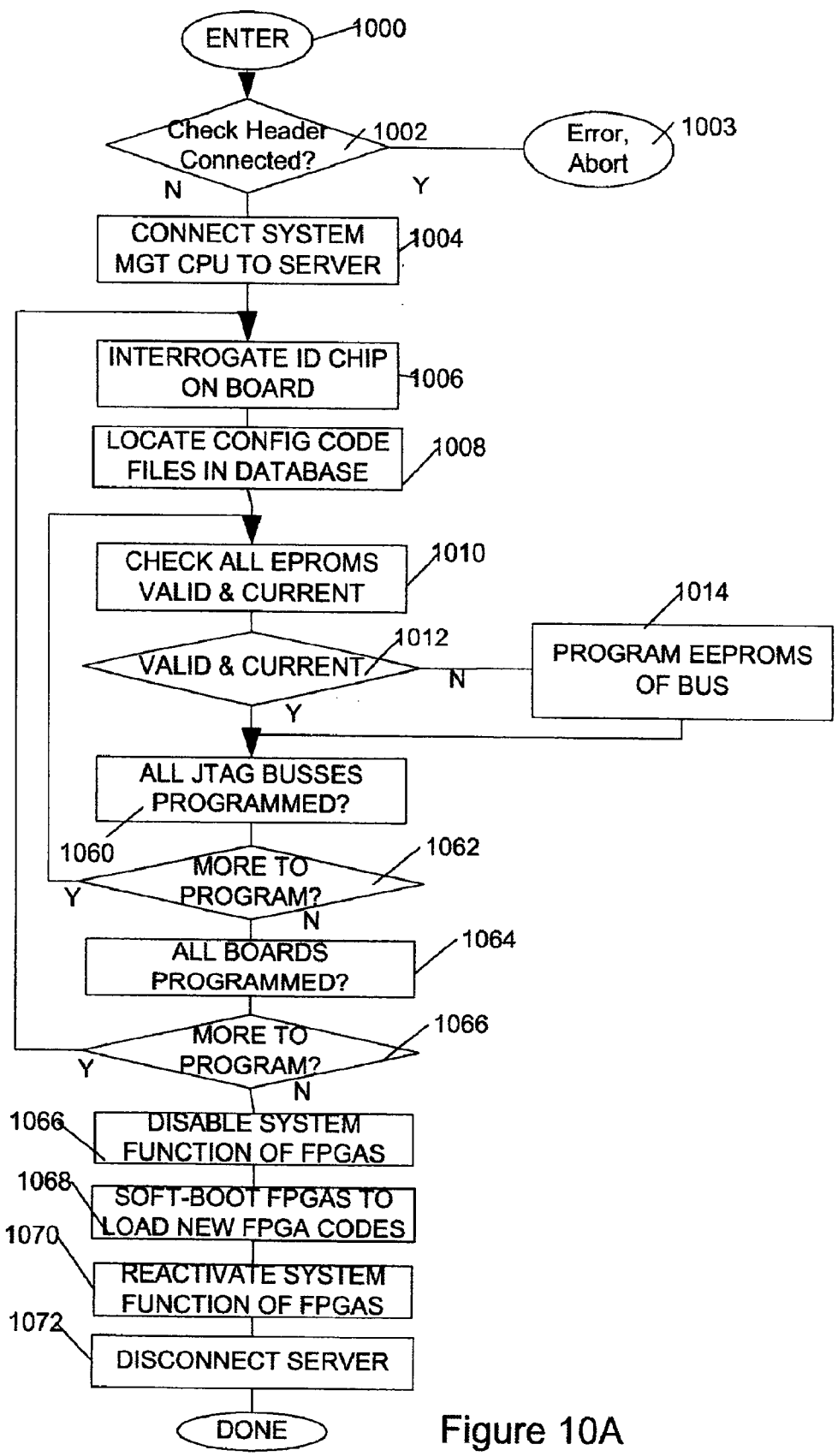
FIG. 10A, a flowchart of a particular alternative embodiment of the method of the present invention.

In an alternative embodiment, the firmware sequence of FIG. 10A executes on a system management processor, such as primary system management processor 526 (FIG. 5), or system management processor 312 (FIG. 3). This sequence is entered 1000 whenever a command to do so is passed from a system processor 236 (FIG. 3), is entered by a terminal connected to the system management processor 312, or when a programmable logic device, such as FPGA 502 (FIG. 5), detects an error while receiving configuration code.

The system management processor 312 checks 1002 if any configuration header, such as header 514, is connected to a configuration system; if a configuration system is connected an error is declared and the sequence is aborted 1003. Processor 312 then connects 1004 through a network 241 to a server 242 having a database 244 of configuration code files. For each board 500 of the system, the system management processor 312 interrogates 1006 a board identification EEPROM 512, if at least one JTAG bus of the board 500 is so equipped, and reads a board identity code from that EEPROM 512. If no such identification EEPROM 512 exists, system management processor 312 determines the JTAG bus configuration for each bus on the board 500, and derives a signature from these configurations; the signature is used as a substitute board identity code. The steps of reading the board identification EEPROM and determining JTAG bus configuration are protected from interference by other system management processors that might attempt to access common configuration logic 516 or 228 by allocating and deallocating (not shown) the common configuration logic.

The board identity code is used as an index to database 244 to locate 1008 configuration code files appropriate for the board 500. Each EEPROM of each bus of board 500 is also tested to determine if the EEPROM contains valid code by verifying a checksum associated with the configuration code in the EEPROM. For EEPROMS having valid code, version information associated with these configuration files is compared with version information in the configuration files of the database 244. If the EEPROMs contain code that is both valid and current 1010, programming of that EEPROM may be bypassed 1012; EEPROMs containing code that is either invalid or not current are programmed 1014.

Figure 10B:
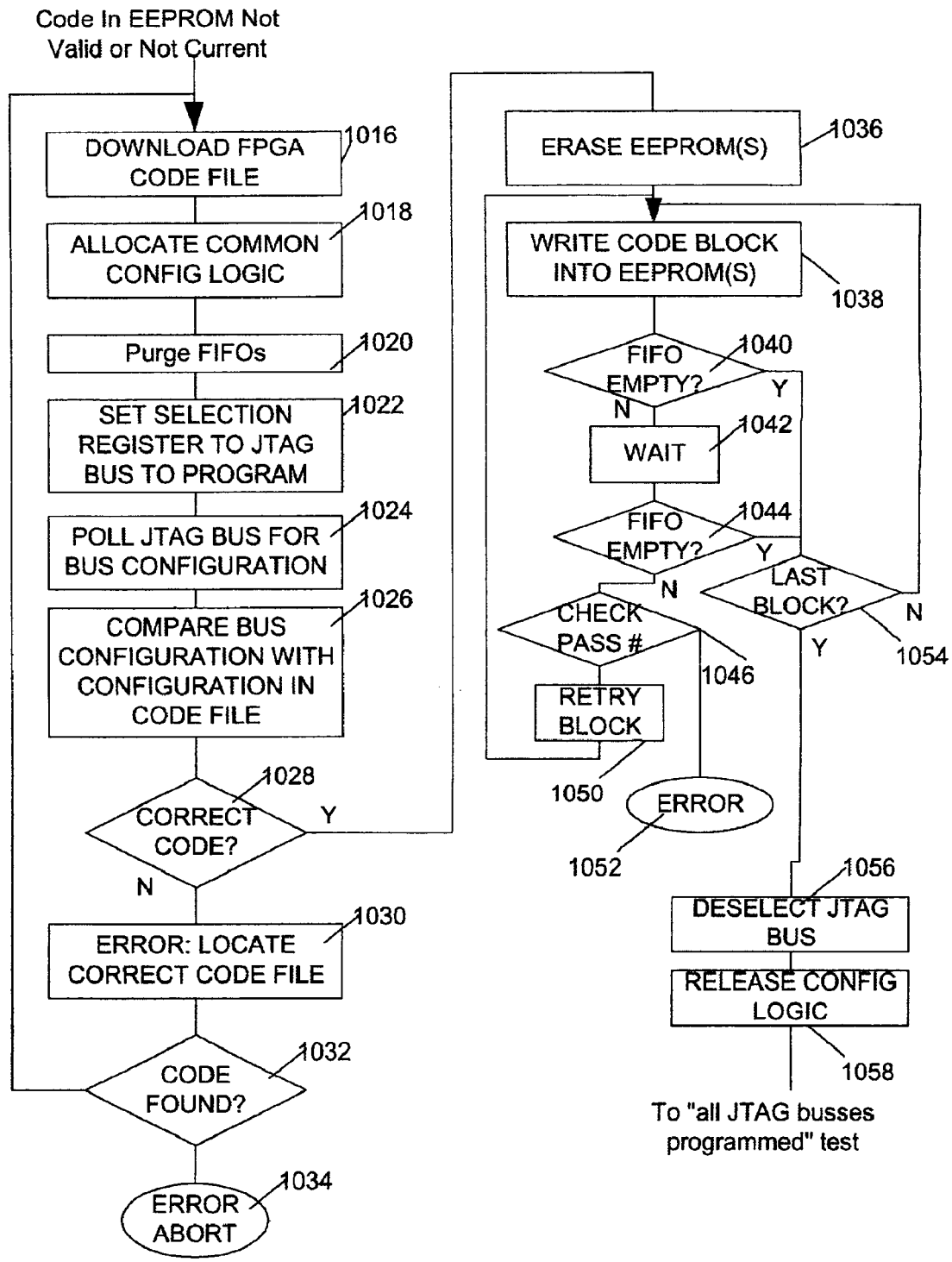
FIG. 10B, a flowchart detailing the "program EEPROMs of bus" step of FIG. 10A.

If any EEPROMs of any JTAG bus of the board contain code that is either invalid or not current, appropriate FPGA code is downloaded 1016 (FIG. 10B) from database 244. Next, the common configuration logic 516 is allocated 1018 and any leftover data is purged 1020 from FIFOs 806 and 808. The selection register is set 1022 to a JTAG bus having EEPROMs to be programmed, and the configuration of that bus is determined 1024. The determined configuration is compared 1026 with expected configuration information in the downloaded code file to ensure that an incorrect code file is not used for programming, and an error is declared if 1028 the code is not correct for the configuration.

If the code is not correct for the configuration, error handler 1030 may make one attempt to locate correct code based upon a signature derived from the determined bus configuration. If 1032 code is found, the sequence restarts by downloading 1016 that code; if it is not found, programming is aborted 1034.

If 1028 the determined bus configuration matched the configuration of the selected JTAG bus, the EEPROMs of the selected JTAG bus are erased 1036, and blocks of code from the downloaded code file are written 1038 into the EEPROMs. At the end of each block, the FIFOs 806 and 808 are checked for empty 1040, if they are not empty the sequence waits 1042 for transfer from FIFO to EEPROM to be completed, and rechecks 1044 the FIFOs 806 and 808 for empty. If the FIFOs are still not empty, or another error occurred, a check of a pass count 1046 is made to determine if the block has been retried already, and if not, the FIFOs are purged and programming of the block is retried 1050. If 1046 the block has already been retried, an error is declared 1052. An error sequence may make further efforts to write the EEPROMs with the block before aborting.

If 1044 the FIFOs emptied correctly, a check 1054 is made for whether the block written was the last block of code; if not the next block is written 1038 to the EEPROMs. If 1054 all blocks have been written, the JTAG bus is deselected 1056, and the common configuration logic is released 1058.

Next, a test is made to determine whether all JTAG busses of the board have been programmed 1060 (FIG. 10A). If 1062 more busses of the board require programming, a bus count is incremented, choosing the next JTAG bus of the board, and EEPROMs of that next bus are tested 1010 to determine if their code is valid and current; this is followed as needed by writing 1014 those EEPROMs that do not contain valid and current code.

If 1062 no more busses of the board require programming, a check 1064 is made for any additional boards of the system having JTAG busses with EEPROMs needing programming. If 1066 additional boards require programming, any identification EEPROM of the next board is interrogated 1006, and the sequence continues with locating 1008 configuration code files for EEPROMs of that board.

If 1064 no boards remain to be programmed, system function of FPGAs for which new configuration code was written 1014 is disabled 1066. These FPGAs are then soft-booted 1068 to reload their configuration code, and their system function is re-enabled 1070. Finally, the management processor disconnects 1072 from the server 242, and a system CPU is informed of actions taken by the management processor so that the system CPU may update a system maintenance log.

The invention has been described with reference to a particular partitioning of functional elements among circuit boards of a computer system embodying the invention. The invention is applicable to alternative partitionings of the system; there may be additional boards, or circuitry, illustrated as on separate boards, that may be combined, as necessary, for a particular embodiment. For example, and not by way of limitation, the common configuration logic illustrated as on Board E 230 could be combined on a circuit board with the circuitry of Board D 204.

While the invention has been particularly shown and described with reference to a preferred embodiment thereof, it will be understood by those skilled in the art that various other changes in the form and details may be made without departing from the spirit and scope of the invention. It is to be understood that various changes may be made in adapting the invention to different embodiments without departing from the broader inventive concepts disclosed herein and comprehended by the claims that follow.

What is claimed is:

1. A method of updating programmable device configuration code stored in EEPROMs of a system comprising the steps of:

providing at least one serial bus interconnecting EEPROMs of the system with a common configuration logic;

obtaining a file of configuration code;

verifying compatibility of the file with the serial bus;

erasing at least one EEPROM of the EEPROMs;

writing at least one block of configuration code to the EEPROMs; and checking for errors after writing blocks, the errors including failure of a FIFO to empty, and retrying the step of writing at least one block upon an error.

2. The method of claim 1, further comprising the step of soft-booting at least one programmable logic device to load configuration code from an EEPROM of the at least one EEPROMs into the programmable logic device.

3. The method of claim 2, wherein the system has more than one processor, and further comprising the step of allocating the common configuration logic to prevent simultaneous access by more than one processor of the system.

4. The method of claim 2, wherein the at least one serial bus interconnecting EEPROMs of the system with a common configuration logic is a plurality of serial busses, and further comprising the step of selecting a particular serial bus of the plurality of serial busses.

5. The method of claim 2, wherein at least one programmable logic device is an FPGA, and wherein the method is executed automatically upon an error loading configuration code from EEPROM into the FPGA.

6. The method of claim 2, wherein at least one programmable logic device is an FPGA, and wherein the method is executed automatically upon an error loading configuration code from EEPROM into the FPGA.

7. The method of claim 1, wherein the at least one serial bus interconnecting EEPROMs of the system with a common configuration logic is a plurality of serial busses, and further comprising the step of selecting a particular serial bus of the plurality of serial busses.

8. A method of updating programmable device configuration code stored in EEPROMs of a system, the system having separate management and system processors, comprising executing a sequence for updating programmable device configuration code on a management processor of the system, the sequence for updating programmable device configuration code further comprising the steps of:

erasing the EEPROMs;

writing at least one block of configuration code to EEPRMs;

checking for errors after writing the at least one block, the errors including failure of a FIFO to empty, and retrying the step of writing at least one block upon error;

verifying that a file contains configuration code compatible with the system;

wherein the step of verifying that a file contains configuration code compatible with the system comprises polling a JTAG bus of the system to determine the configuration of the JTAG bus, and comparing the configuration with a configuration stored in the file.

* * * * *